United States Patent
Ravid et al.

(10) Patent No.: US 6,972,965 B2
(45) Date of Patent: Dec. 6, 2005

(54) METHOD FOR INTEGRATED HIGH Q INDUCTORS IN FCGBA PACKAGES

(75) Inventors: Shmuel Ravid, Haifa (IL); Ra'anan Sover, Haifa (IL)

(73) Assignee: Intel Corporation, Santa Clara, CA (US)

( * ) Notice: Subject to any disclaimer, the term of this patent is extended or adjusted under 35 U.S.C. 154(b) by 254 days.

(21) Appl. No.: 10/358,794

(22) Filed: Feb. 4, 2003

(65) Prior Publication Data

US 2004/0150968 A1 Aug. 5, 2004

(51) Int. Cl.⁷ ............................ H05K 7/06; H01L 23/66
(52) U.S. Cl. ................... 361/777; 361/782; 361/783; 257/724; 257/728; 257/778
(58) Field of Search ................... 361/760, 777, 361/782, 783; 257/691, 700, 723, 724, 728, 257/778, 786

(56) References Cited

U.S. PATENT DOCUMENTS

| | | | | |
|---|---|---|---|---|
| 5,519,582 A | * | 5/1996 | Matsuzaki | 361/783 |
| 5,694,300 A | * | 12/1997 | Mattei et al. | 361/818 |
| 6,081,030 A | * | 6/2000 | Jaouen et al. | 257/728 |
| 6,218,729 B1 | * | 4/2001 | Zavrel et al. | 257/698 |
| 6,310,386 B1 | * | 10/2001 | Shenoy | 257/531 |
| 6,362,525 B1 | * | 3/2002 | Rahim | 257/738 |
| 6,365,978 B1 | * | 4/2002 | Ibnabdeljalil et al. | 257/786 |
| 6,549,071 B1 | * | 4/2003 | Paul et al. | 330/252 |
| 6,781,471 B2 | * | 8/2004 | Huang | 331/117 R |
| 2001/0024153 A1 | * | 9/2001 | Farrar et al. | 336/200 |
| 2003/0001712 A1 | * | 1/2003 | Zou et al. | 336/200 |
| 2004/0204151 A1 | * | 10/2004 | Muthuswamy et al. | 455/567 |

OTHER PUBLICATIONS

J.M. Lopez-Villegas, J. Samitier, C. Cane, P. Losantos, J. Bausells; "Improvement of the Quality Factor of RF Integrated Inductors by Layout Optimisation", IEEE Transactions on Microwave Theory and Techniques, vol. 48, No. 1, pp. 76-83; 2000.

* cited by examiner

Primary Examiner—John B. Vigushin
(74) Attorney, Agent, or Firm—Blakely, Sokoloff, Taylor & Zafman LLP

(57) ABSTRACT

A high quality factor on-package, off-die inductor assembly is disclosed. The assembly includes a flip-chip, ball-grid array package substrate, an on-package, off-die trace line is coupled to one or more bumps attached to an upper surface of the package substrate. The trace line has a self-inductance and a predetermined length. The quality factor associated with the inductor is a ratio of the trace line's inductance to the trace lines resistance. The package substrate is a low loss laminate.

26 Claims, 3 Drawing Sheets

METHOD FOR INTEGRATED HIGH Q INDUCTORS IN FCGBA PACKAGES

FIELD OF THE INVENTION

The field of the invention relates to wireless transceivers generally, and more particularly, to high quality factor inductors integrated in flip-chip, ball-grid array (FCBGA) packages.

BACKGROUND

A low phase noise synthesizer is one of the basic ingredients of a modern wireless system. Such a synthesizer is generated using a low phase noise voltage controlled oscillator (VCO) that is formed on a microelectronic die. A microelectronic die forms an integral part of a FCBGA package. Within the package, a package laminate is attached to the microelectronic die via an array of bumps disposed on an upper surface of the laminate.

The VCO utilizes a capacitor and an inductor that are printed onto the microelectronic die. These components work together to determine the frequency at which the oscillator will operate. A significant disadvantage of this design is that the resistance inherent in the silicon itself significantly reduces the quality factor (Q-factor) of the inductor. In mathematical terms, the Q-factor equals inductance divided by resistance. Thus, the higher the resistance, the lower the Q-factor will be. It is difficult to create high Q inductors on silicon because the Q-factors that can be realized for silicon are on the order of about 4–5. In contrast, the Q-factor needed for a low phase noise VCO is on the order of about 50.

The prior art has developed three solutions to create high Q-factors. These solutions include: using an inductor external to the package itself; using a bond wire as an inductor; and using a VCO external to the die itself All three solutions are problematic. Using external inductors, for example, requires extra inductors and is a bulky kind of solution that requires extra production tuning. The extra production tuning translates into extra manufacturing costs. Although bond wires are used as inductors, the production tolerances vary widely from bond wire to bond wire. These variations are difficult to control and render this solution unreliable. External VCO's are reliable and easily manufactured. Their use, however, increases production costs significantly.

DESCRIPTION OF THE DRAWINGS

The invention is illustrated by way of example, and not limitation, in the figures of the accompanying drawings, in which.

DETAILED DESCRIPTION

An apparatus and method for providing integrated high quality factor inductors. For one embodiment, a trace-line inductor is used in a VCO circuit of a transceiver for a radio-based (wire-less) communications device. In the following detailed description, numerous specific details are set forth in order to provide a thorough understanding of the various embodiments of the invention. However, it will be apparent to one of ordinary skill in the art that these specific details need not be used to practice an embodiment of the invention. In other circumstances, well-known structures, materials, or processes have not been shown or described in detail in order not to unnecessarily obscure the embodiment of the invention.

Reference is made to the accompanying drawings, in which like references indicate similar elements, and in which is shown by way of illustration, specific embodiments in which the invention may be practiced. These embodiments are described in sufficient detail to enable those skilled in the art to practice the invention. The following detailed description is, therefore, not to be taken in a limiting sense, and the scope of the embodiment of the invention is defined only by the appended claims.

Figure 1:
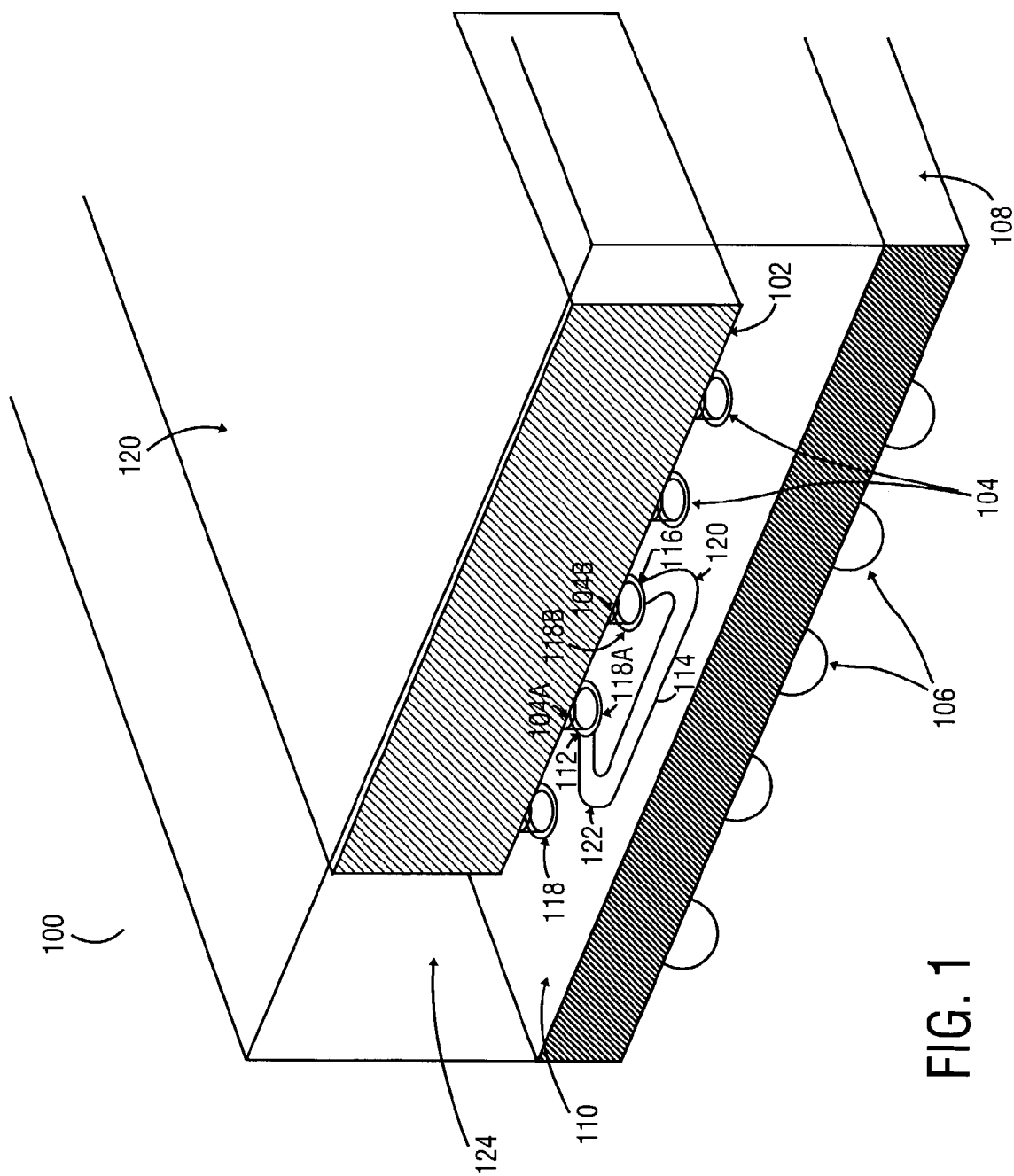
FIG. 1 is a perspective view of a flip-chip, ball-grid array (FCBGA) package having an on-package off-die trace line inductor, according to one embodiment of the invention.

FIG. 1 is a perspective view of a flip-chip, ball-grid array (FCBGA) package 100 having an on-package, off-die, trace line inductor, according to one embodiment of the invention. At the base of FCBGA package 100 is a package substrate 108, which has an upper surface 110 and a lower surface. The package substrate is formed of a low loss laminate that serves as a sort of miniature circuit board. Formed of a copper type material, the low loss laminate has a lesser internal resistance than the microelectronic die 102. Consequently, the substrate 108 supports higher quality factor inductors than can be formed on microelectronic die 102.

An array of conductive interconnects 106 (e.g., solder balls) is attached to the lower surface of package substrate 108. When FCBGA package 100 is mounted on a printed circuit board (PCB) as part of a wireless or a computer device, each of conductive interconnects 106 contacts a corresponding pad formed on the PCB. When heat is applied, conductive interconnects 106 melt and bond FCBGA package 100 to the PCB. In operation, electrical signals are passed between components in the package substrate 108 and the printed circuit board via the ball/pad interconnections.

On the upper surface 110 of the package substrate 108 is disposed an array of bumps 104 (e.g. solder bumps). In one embodiment the bumps 104 are electrically conductive and attached to a lower surface of microelectronic die 102, as shown in FIG. 1. At the base of each bump 104 is a metal land 118. Each metal land 118 protrudes from and encircles the circumference of each bump 104. The lands 118 provide an electrical connection between ends 112 and 116 of trace line 114 and bumps 104A, 104B, respectively. In one embodiment, the bumps 104 are solder and the lands 118 are copper.

Microelectronic die 102 is a silicon substrate that forms an integral part of FCBGA package 100. Die 102 includes an upper surface 120 and a lower surface. The lower surface is attached to the bumps 104 that are attached to upper surface 110 of the package substrate 108. The bumps 104 are reflowed to the substrate 108. In one embodiment, an adhesive epoxy is injected between the microelectronic die 102 and the package substrate 108 to fixably attach microelectronic die 102 to bumps 104. A molded encapsulation material 124 (e.g., plastic filler) is attached to the upper surface 110 of package substrate 108. The molded encapsulation material completely covers microelectronic die 102 to protect it from contaminates. The molded encapsulation material 124 also gives FCBGA package 100 a blocked shape.

Trace line 114 is plated onto upper surface 110 of package substrate 108 prior to the molding of encapsulation material 116. The techniques, methods, and materials used to form trace line 114 on package substrate 108 are readily understood by persons skilled in the art, and are not delineated here for brevity's sake. However, such techniques, methods, and materials are within the spirit and scope of the embodiment of the invention as claimed.

Referring again to FIG. 1, trace line 114 has two ends, and for one embodiment is substantially elliptically shaped in the form of a "C". The shape and length can vary for alternative embodiments. A first end 112 is electrically coupled to a first land 118A that is attached to the base of bump 104A. A second end 116 is electrically coupled to a second land 118B that is attached to the base of bump 104B. For the embodiment shown in FIG. 1, trace line 114 is disposed on an outer row of bumps 104, near an edge of package substrate 108. For alternative embodiments, trace line 114 need not disposed near the edge of the package substrate 108. The body of the "C" is outside of the outer row of bumps 104 and substantially parallels the edge of package substrate 108. In alternative embodiments, one or more additional trace lines are formed on an inner and outer rows of the bump array.

Trace line 114 has a predetermined length that varies depending upon the frequency of resonance desired and the value of a capacitor that is operatively coupled to it. In one embodiment, however, the length of trace line 114 is in a range of approximately 0.1 mm to approximately 10 mm. The frequency of response is in the range of approximately 0.1 GHz to approximately 100 GHz. The length of trace line 114 is a measurement of the straight-line distance separating the outer edge of shoulder 122 from the outer edge of shoulder 120. In an alternative embodiment, the length of trace line 114 is a measurement of the total path length between the edge of first end 112 and the edge of second end 116. The length of trace 114 is important because inductance is determined by the length of the trace and the contact to the die. Generally, the longer the trace the higher the inductance. The overall length of the trace-line on the laminate plus the solder bump plus the trace on the die make up the total inductance value. In order to achieve a higher Q factor, the ratio of the trace lines length on die as compared to the trace line length on laminate is reduced (i.e., the trace line length on laminate is much greater than the trace line on the die).

In one embodiment, trace line 114 is not associated with interconnections on or off of FCBGA package 100. Instead the trace line 114 is routed from a microelectronic die 102 back to the microelectronic die 102 to produce an inductive circuit. Current from the circuit on microelectronic die 102 flows directly through the trace line 114. Creation of an inductive circuit is made possible by the self-inductance values inherent in the trace line 114 and in the bumps 104. These self-inductance values are utilized instead or in conjunction with on-die inductive components, to form the desired inductive circuit. Thus, in one embodiment, trace line 114 functions as a high quality inductor.

In mathematical factor terms, the Q-factor is simply the ratio of inductance divided by resistance. The greater the resistance, the smaller the Q-factor for a given inductance. Illustratively, a substrate formed of a material such as silicon that has a high dielectric constant, will have a high parasitic resistance, and thus, a correspondingly low Q-factor. The higher the Q-factor the better the quality of the transmitted signal will be.

An advantage of one embodiment of the invention is that a high-Q inductor can be achieved by mounting trace line 114 on the low loss laminate 108 instead of on the microelectronic die as taught by the prior art. Another advantage of the embodiment of the invention as claimed is the elimination of bond wires. When used as inductors, bond wires are attached either to the microelectronic die 102 or to the package substrate 108. Bond wire solutions, however, are not highly repeatable, meaning that it is difficult to attach significant numbers of bond wire inductors to a plurality of packages and still maintain acceptable operating tolerances. Often, bond wire connections are out of tolerance length and shape and hence have a correspondingly varied inductance from one sample to another that will cause the frequency to shift from one sample to the next. For wireless radio frequency (RF) devices, high Q-factors are preferred because the Q-factor is the limiting factor behind the quality of the transmitted RF signal.

Embodiments of the claimed invention, however, eliminate the bond wires entirely. Substituted in their place, are traces internal to the package that are highly repeatable. The term repeatable means that the traces can be formed over and over again and still remain within a predetermined range of tolerances.

Figure 2:
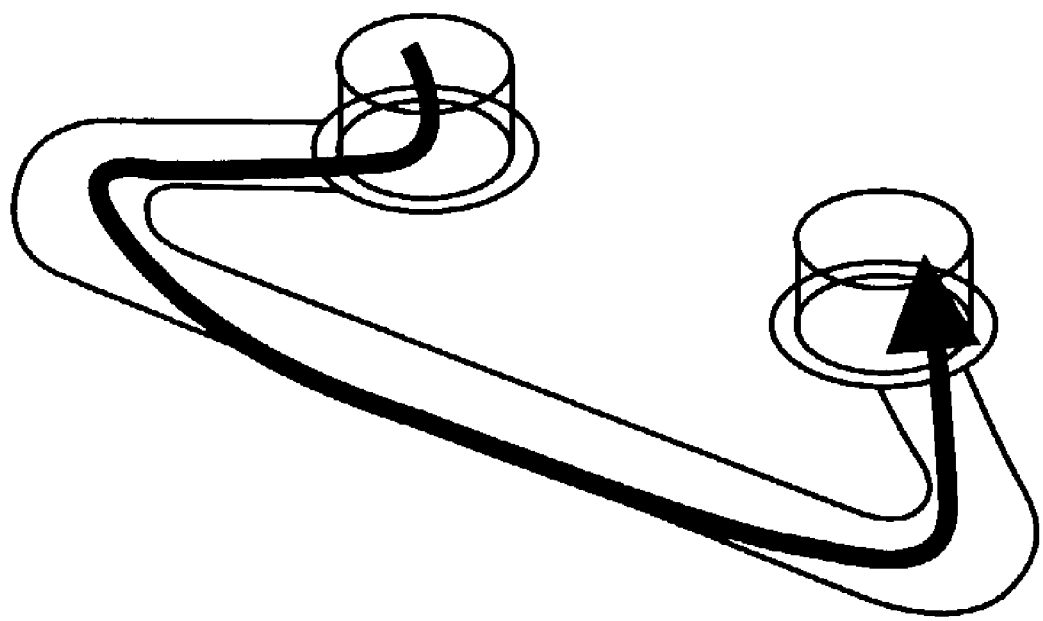
FIG. 2 is a perspective view of a on-package, off-die trace line inductor, according to one embodiment of the invention.

FIG. 2 is a perspective view of a trace line inductor 114 according to one embodiment of the invention. As previously described with respect to FIG. 1, the ends of trace line inductor 114 are coupled to bumps 104A and 104B. The bumps 104A and 104B are formed on an upper surface 110 of package substrate 108 as previously described. As discussed above, the overall length of the trace-line on the laminate plus the solder bump plus the trace on the die make up the total inductance value so the trace lines length on die is reduced as compared to the trace line length on laminate. Additionally, mounting the trace line inductor on the upper surface of the package substrate 102 and then encasing it in molded plastic prevents EMI/RFI signals associated with that inductor from interfering with other devices on the PCB. In various embodiments of the invention multiple trace-line inductors may be implemented on the package laminate.

Figure 3:
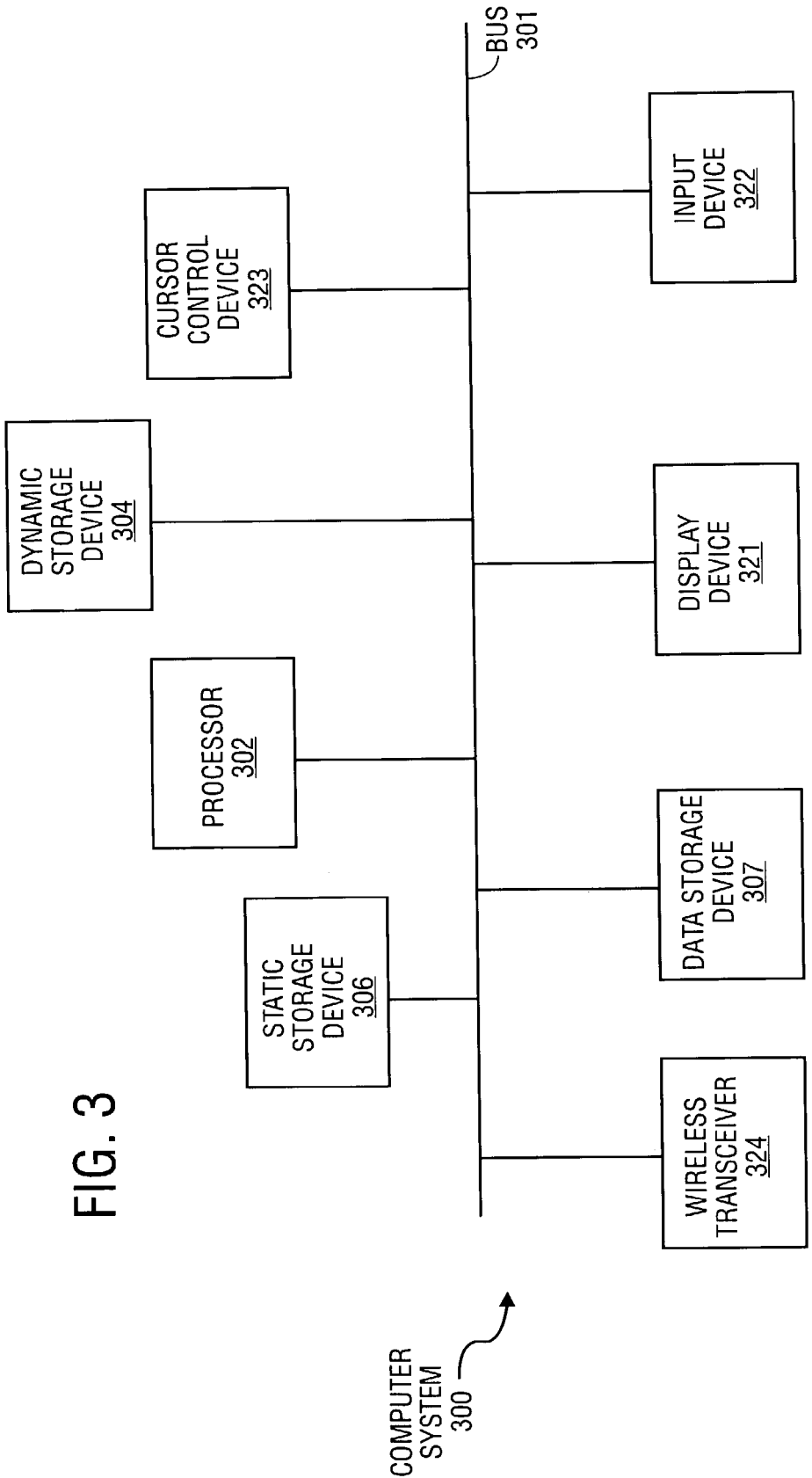
FIG. 3 is a diagram of a computer system usable with embodiments of the invention.

FIG. 3 is a diagram illustrating one embodiment of a computer system 300 that may be used with embodiments of the invention in which the features of the claimed invention may be implemented. Computer system 300 is comprised of a bus or other communications means 301 for communicating information, and a processing means such as processor 302 coupled with bus 301 for processing information. Computer system 300 further comprises a random access memory (RAM) or other dynamic storage device 304 (commonly referred to as main memory), coupled to bus 301 for storing information and instructions to be executed by processor 302. Main memory 304 also may be used for storing temporary variables or other intermediate information during execution of instructions by processor 302. Computer system 300 also includes a read only memory (ROM) and/or other static storage device 306 coupled to bus 301 for storing static information and instructions for processor 302.

An optional data storage device 307 such as a magnetic disk or optical disk and its corresponding drive may also be coupled to computer system 300 for storing information and instructions. Computer system 300 can also be coupled via bus 301 to a display device 321, such as a cathode ray tube (CRT) or a liquid crystal display (LCD), for displaying information to a computer user. For example, image, textual, or graphical depictions of product data and other types of image, graphical, or textual information may be presented to the user on display device 321. Typically, an alphanumeric input device 322, including alphanumeric and other keys is coupled to bus 301 for communicating information and/or command selections to processor 302. Another type of user input device is cursor control device 323, such as a conventional mouse, trackball, or other type of cursor direction keys for communicating direction information and command selection to processor 302 and for controlling cursor movement on display 321.

Although the claimed invention is described herein with reference to various illustrative embodiments, many modifications and variations therein will readily occur to those with ordinary skill in the art. Accordingly, all such variations and modifications are included within the intended scope of the invention as defined by the following claims.

What is claimed is:

1. An inductor assembly, comprising:
   a flip-chip, ball-grid array package substrate;
   a microelectronic die coupled to one or more bumps attached to an upper surface of the package substrate; and
   an on-package, off-die trace line coupled to the one or more bumps attached to the upper surface of the package substrate, wherein the trace line has an inherent self-inductance that is used in combination with on-die inductive components to achieve a predetermined frequency of resonance or other matching network of RF frequencies.

2. The inductor assembly of claim 1, wherein a length of the trace line is in the range of approximately 0.1 mm to approximately 10.0 mm.

3. The inductor assembly of claim 1, wherein no bond wires are used to couple the trace line to a microelectronic die that is attached to the package bumps.

4. The inductor assembly of claim 1, wherein no bond wires are used to couple the trace line to the package substrate or to the package bumps.

5. The inductor assembly of claim 1, wherein the trace line is not associated with interconnections on or off the package.

6. The inductor assembly of claim 2, wherein the trace line has a high quality factor, the quality factor being a ratio of the trace line's inductance to the trace line's resistance.

7. The inductor assembly of claim 6, further comprising:
   a molded encapsulation material attached to the upper surface of the package substrate and covering the microelectronic die to form a protective housing.

8. The inductor assembly of claim 7, wherein EMI/RFI emissions associated with the trace line are substantially contained within the package and do not substantially interfere with other board signals.

9. The inductor assembly of claim 6, wherein the trace line is a component of a low phase noise voltage controlled oscillator or other matching network for RF frequencies.

10. The inductor assembly of claim 1, further comprising:
    a wireless transceiver coupled to a low phase voltage controlled oscillator or other matching networks of RF frequencies.

11. The inductor assembly of claim 10, wherein the frequency of resonance is in the range of approximately 0.1 Ghz to approximately 100 GHz.

12. The inductor assembly of claim 10, wherein the trace line's self-inductance contributes to a reduced bit error rate in the wireless transceivers.

13. The inductor assembly of claim 10, wherein the frequency of resonance is in the range of approximately 0.1 Ghz to approximately 100 GHz.

14. A wireless communications device, comprising:
    a package substrate;
    a plurality of bumps disposed on an upper surface of the package substrate;
    a microelectronic die coupled to the plurality of bumps; and
    an on-laminate, off-die trace line having an inherent self-inductance; the trace line coupled to one or more of the plurality of bumps, the trace line's self-inductance used in combination with on-die inductive components to achieve a predetermined frequency of response.

15. The wireless communications device of claim 14, further comprising:
    a low phase noise voltage controlled oscillator formed on the package substrate; and
    a wireless transceiver coupled with the low phase noise voltage controlled oscillator or other matching networks of RF frequencies.

16. The wireless communications device of claim 15, wherein the trace line is a component of the low phase voltage noise controlled oscillator or other matching networks of RF frequencies.

17. The wireless communications device of claim 16, wherein no bond wires are used to couple the trace line to the microelectronic die.

18. The wireless communications device of claim 16, wherein the trace line's self-inductance contributes to a reduced bit error rate in the wireless transceiver.

19. The wireless communications device of claim 16, wherein the predetermined frequency of response is in a range of approximately 0.1 GHz to 100 Ghz.

20. The wireless communications device of claim 15, wherein the trace line has a high quality factor, the quality factor being a ratio of the trace line's inductance to the trace line's resistance.

21. A computer comprising:
    a bus;
    a processor coupled to the bus;
    memory device coupled to the bus to store computer readable instructions to be executed by the processor;
    a wireless transceiver coupled to the bus to transmit and receive data over a predetermined radio frequency; and
    a semiconductor package associated with the bus, the package including:
    a package substrate;
    a microelectronic die connected to the substrate; and
    an on-substrate, off-die trace line formed on the upper surface of the package substrate, the trace line having an inherent self-inductance being coupled to one or more of a plurality of bumps attached to the upper surface of the substrate, the self-inductance used in combination with on-die inductive components to achieve a predetermined frequency of resonance or other matching network of RF frequencies.

22. The computer of claim 21, further comprising:
    a low phase noise voltage controlled oscillator formed on the package substrate, wherein the trace line is a component of a low phase noise voltage controlled oscillator.

23. The computer of claim 22, wherein the trace line has a high quality factor, the quality factor being a ration of the trace line's inductance to the trace line's resistance.

24. The computer of claim 22, wherein no bond wires are used to couple the trace line to the package substrate.

25. The computer of claim 22, wherein the radio frequency is in the range of approximately 0.1 GHz to approximately 100 GHz.

26. The computer of claim 21, further comprising:
    a wireless transceiver formed on the package substrate, wherein the trace line is a component of impedance matching of RF networks.

* * * * *